(12) United States Patent
Li et al.

(10) Patent No.: US 11,244,966 B2
(45) Date of Patent: Feb. 8, 2022

(54) MICRO-LED DISPLAY PANEL WITH STRESS RELEASING STRUCTURE AND METHOD FOR FABRICATING THE SAME

(71) Applicant: BOE Technology Group Co., Ltd., Beijing (CN)

(72) Inventors: Haixu Li, Beijing (CN); Zhanfeng Cao, Beijing (CN); Ke Wang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 6 days.

(21) Appl. No.: 16/682,395

(22) Filed: Nov. 13, 2019

(65) Prior Publication Data
US 2020/0235127 A1    Jul. 23, 2020

(30) Foreign Application Priority Data
Jan. 17, 2019   (CN) .......................... 201910043017.8

(51) Int. Cl.
*H01L 27/12* (2006.01)
*H01L 25/075* (2006.01)

(52) U.S. Cl.
CPC ........ *H01L 27/124* (2013.01); *H01L 25/0753* (2013.01); *H01L 27/1259* (2013.01)

(58) Field of Classification Search
CPC ............. H01L 27/3258; H01L 27/1248; H01L 27/124; H01L 27/1259; H01L 25/0753; H01L 33/62; H01L 25/167; H01L 33/00–648; H01L 27/15–156; H01L 2933/00–0091; H01L 51/50–56;
(Continued)

(56) References Cited

U.S. PATENT DOCUMENTS

| 2002/0005583 A1 | 1/2002 | Harada et al. |
| 2005/0029014 A1* | 2/2005 | Miura .................... H05K 3/426 174/262 |
| 2017/0278913 A1* | 9/2017 | Zhang ................. H01L 27/3258 |

(Continued)

FOREIGN PATENT DOCUMENTS

| CN | 101853830 A | 10/2010 |
| CN | 107170773 A | 9/2017 |

(Continued)

OTHER PUBLICATIONS

Chinese Office Action in corresponding 201910043017.8 dated Jun. 12, 2020.

*Primary Examiner* — Mohammad M Hoque
(74) *Attorney, Agent, or Firm* — Arent Fox LLP; Michael Fainberg

(57) ABSTRACT

A micro LED display panel and a method for fabricating the same are disclosed, and the micro LED display panel includes a TFT back panel, and a micro LED fixed on the TFT back panel, wherein the TFT back panel includes a substrate, and a first insulation layer and a second insulation layer stacked over the substrate in that order, wherein the first insulation layer includes a groove filled with the second insulation layer, and a normal projection of the groove onto the substrate does not overlap with a normal projection of a TFT area in the TFT back panel onto the substrate, wherein the rigidity of the second insulation layer is lower than the rigidity of the first insulation layer.

11 Claims, 2 Drawing Sheets

(58) Field of Classification Search
CPC ....... H01L 51/0032–0095; H01L 27/32–3297; H01L 2251/50–568; B32B 2457/206
USPC .......................................................... 257/72
See application file for complete search history.

(56) References Cited

U.S. PATENT DOCUMENTS

| | | |
|---|---|---|
| 2017/0345801 A1 | 11/2017 | Lin et al. |
| 2018/0026129 A1* | 1/2018 | Ren ....................... H01L 29/405 257/329 |
| 2018/0342492 A1 | 11/2018 | Lu |
| 2018/0351056 A1* | 12/2018 | Huang .................. H01L 27/156 |
| 2019/0131368 A1 | 5/2019 | Zhang et al. |
| 2020/0411600 A1* | 12/2020 | Yang ..................... H01L 27/323 |

FOREIGN PATENT DOCUMENTS

| | | | |
|---|---|---|---|
| CN | 107437551 A | | 12/2017 |
| CN | 107658333 A | | 2/2018 |
| KR | 2016001876 A | * | 1/2016 |

\* cited by examiner

MICRO-LED DISPLAY PANEL WITH STRESS RELEASING STRUCTURE AND METHOD FOR FABRICATING THE SAME

CROSS-REFERENCE TO RELATED APPLICATION

This Disclosure claims priority to Chinese Patent Application No. 201910043017.8, filed on Jan. 17, 2019, the content of which is incorporated by reference in the entirety.

FIELD

The disclosure relates to the field of display technologies, and in some embodiments to a micro-LED (Light Emitting Diode) display panel and a method for fabricating the same.

BACKGROUND

Micro LEDs belong to a new generation of display technologies, and provide higher brightness, a better light-emission effect, and lower power consumption than the existing OLED (Organic Light Emitting Diode) technologies. In the related art, some manufacturers have come to their research and development of the new generation of display technologies, for example, start to research and develop fabricating processes and structures of a glass substrate to which the micro LED technologies are applied. However, micro LED display devices in a new display device are typically welded by firstly bonding tin paste on a back panel, and then pressing and welding the micro LEDs on the back panel, where a pressing stress may affect a TFT (Thin Film Transistor) characteristic in this process, thus resulting in a display abnormality.

SUMMARY

Embodiments of the disclosure provide a micro LED display panel and a method for fabricating the same.

In an aspect, the embodiments of the disclosure provide a micro LED display panel including a TFT back panel, and a micro LED fixed on the TFT back panel, wherein the TFT back panel includes a substrate, and a first insulation layer and a second insulation layer stacked over the substrate in that order, wherein: the first insulation layer includes a groove filled with the second insulation layer, and a normal projection of the groove onto the substrate does not overlap with a normal projection of a TFT area in the TFT back panel onto the substrate, and the rigidity of the second insulation layer is lower than the rigidity of the first insulation layer.

In some embodiments, the first insulation layer is an inorganic insulation layer, and the second insulation layer is an organic insulation layer.

In some embodiments, the TFT area includes an active layer, and a distance between a bottom of the groove, and the substrate is shorter than or equal to a distance between a surface of the active layer facing the substrate, and the substrate, in a direction perpendicular to the substrate.

In some embodiments, the groove includes at least one first groove, and a normal projection of the at least one first groove onto the substrate lies in a normal projection of a welding area of the micro LED onto the substrate.

In some embodiments, the welding area includes a first connection pad and a second connection pad insulated from each other, and to be connected respectively with two connection pins of the micro LED, and the first connection pad and the second connection pad are on a side of the second insulation layer facing away from the first insulation layer.

In some embodiments, the at least one first groove is arranged in a part of the first insulation layer corresponding to an area between the two connection pins of the micro LED; or the at least one first groove is arranged in a part of the first insulation layer corresponding to the first connection pad and/or the second connection pad.

In some embodiments, the groove further includes at least one second groove, and a normal projection of the at least one second groove onto the substrate lies around the normal projection of the welding area of the micro LED onto the substrate.

In some embodiments, a bottom of the groove is shaped as a circle, and a diameter of the circle is larger than or equal to 5 μm, and smaller than or equal to 8 μm.

In some embodiments, a section of the groove perpendicular to the substrate is an inverted trapezoid, and angles between side edges of the trapezoid, and a plane parallel to the substrate are larger than or equal to 30°, and smaller than or equal to 70°.

In some embodiments, a thickness, of a part of the second insulation layer other than a part of the second insulation layer filled in the groove, in a direction perpendicular to the substrate is larger than or equal to 2.5 μm.

In some embodiments, the TFT back panel includes:
  a buffer layer, an active layer, a first gate insulation layer, a gate layer, a second gate insulation layer, and an interlayer dielectric layer stacked over the substrate in that order;
  a source and drain layer on a side of the interlayer dielectric layer facing away from the second gate insulation layer, and electrically connected with the active layer; and
  a planarization layer on a side of the source and drain layer and the interlayer dielectric layer facing way from the second insulation layer;
  wherein the first insulation layer includes the first gate insulation layer, the second gate insulation layer, and the interlayer dielectric layer, and the second insulation layer includes the planarization layer.

In some embodiments, the groove extends through the second gate insulation layer, the first gate insulation layer, and the interlayer dielectric layer.

In another aspect, the embodiments of the disclosure further provide a method for fabricating a micro LED display panel including a TFT back panel, and a micro LED fixed on the TFT back panel, wherein the method includes:
  providing a substrate;
  forming a first insulation layer on the substrate;
  forming a groove at the first insulation layer in an etching process, wherein a normal projection of the groove onto the substrate does not overlap with a normal projection of a TFT area in the TFT back panel onto the substrate; and
  forming a second insulation layer on the first insulation layer, wherein a part of the second insulation layer is filled in the groove, and a rigidity of the second insulation layer is lower than a rigidity of the first insulation layer.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

The technical solutions according to the embodiments of the disclosure will be described below clearly and fully with reference to the drawings in the embodiments of the disclosure, and apparently the embodiments to be described are only a part but not all of the embodiments of the disclosure. Based upon the embodiments of the disclosure, all the other embodiments which can occur to those ordinarily skilled in the art shall fall into the claimed scope of the invention.

Figure 1:
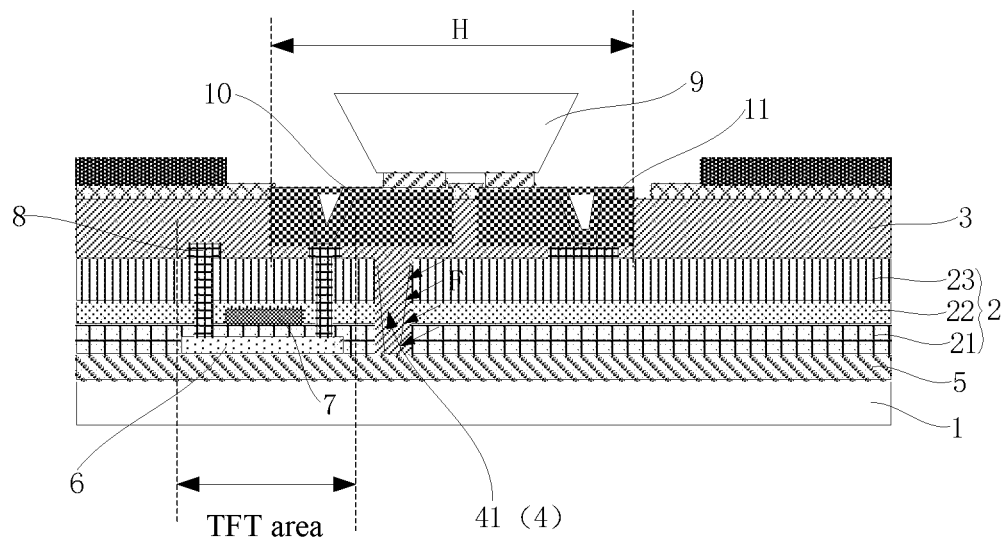
FIG. 1 is a schematic structural diagram of a part of a micro LED back panel in a micro LED display panel according to the embodiments of the disclosure in a sectional view.
Figure 2:
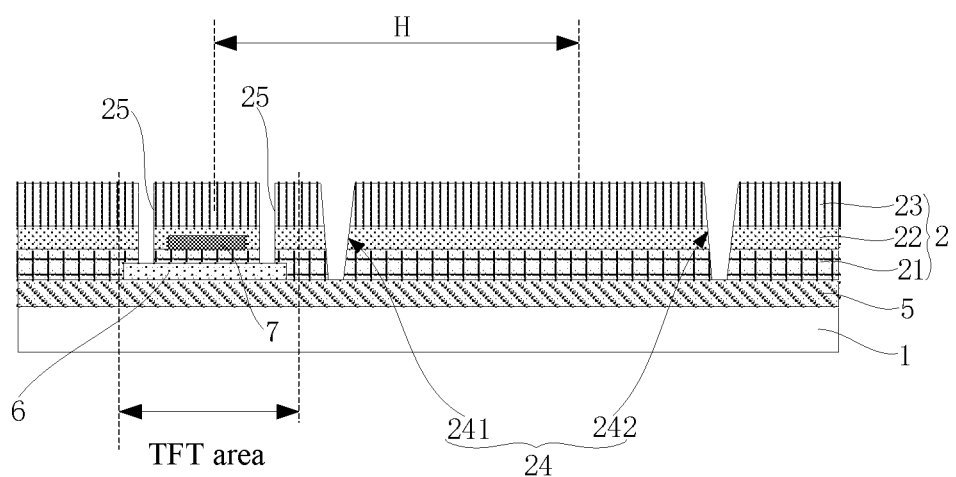
FIG. 2 is a schematic structural diagram of layers in a part of a micro LED back panel in a micro LED display panel according to the embodiments of the disclosure in a sectional view.
Figure 3:
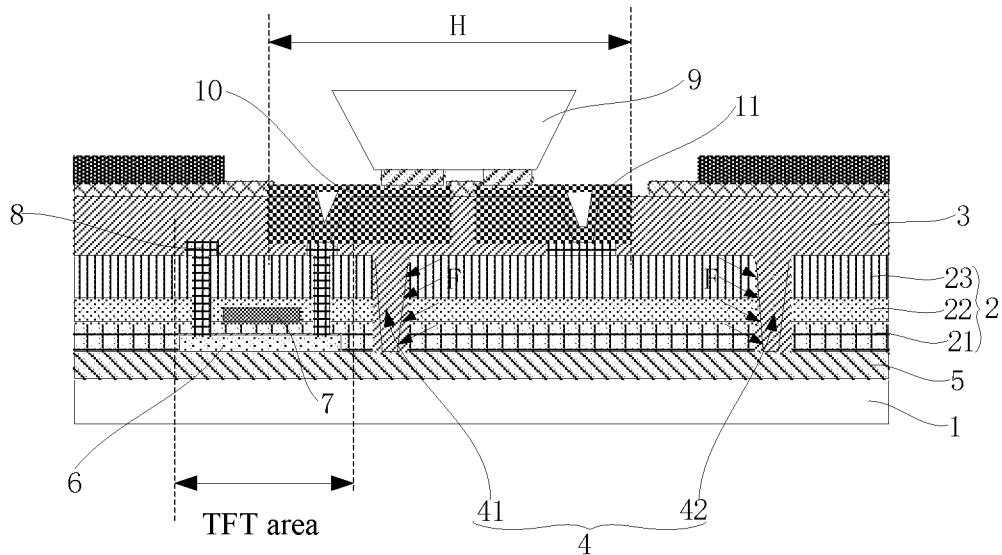
FIG. 3 is another schematic structural diagram of a part of a micro LED back panel in a micro LED display panel according to the embodiments of the disclosure in a sectional view.

As illustrated in FIG. 2 and FIG. 3, a micro LED display panel according to the embodiments of the disclosure includes a TFT back panel, and a micro LED 9 fixed on the TFT back panel, and the TFT back panel includes a substrate 1, and a first insulation layer 2 and a second insulation layer 3 stacked over the substrate 1 in that order, where the first insulation layer 2 includes a groove 24 filled with the second insulation layer 3, and a normal projection of the groove 24 onto the substrate 1 does not overlap with a normal projection of a TFT area (as illustrated in FIG. 1) in the TFT back panel onto the substrate 1, where a rigidity of the second insulation layer 3 is lower than a rigidity of the first insulation layer 2.

The micro LED display panel above includes the TFT back panel, the first insulation layer 2 is arranged on the substrate 1 of the TFT back panel, and the second insulation layer 3 is arranged on the first insulation layer 2, where for the sake of a convenient description, a direction from the substrate 1 to the first insulation layer 2 is up, that is, the second insulation layer 3 is located above the first insulation layer 2. The groove 24 is arranged at the first insulation layer 2, where there can be a plurality of grooves 24, and where the groove 24 does not overlap with the TFT area in the TFT back panel, that is, the normal projection of the groove 24 onto the substrate 1 does not overlap with the normal projection of the TFT area in the TFT back panel onto the substrate 1. A part of the second insulation layer 3 is filled in the groove 24, and the rigidity of the material of the second insulation layer is lower than the rigidity of the material of the first insulation layer, so the groove 24, and the part of the second insulation layer 3 filled in the groove 24 constitute a stress releasing structure 4. Since the rigidity of the material of the second insulation layer 3 is lower than the rigidity of the material of the first insulation layer 2, there is such a difference in rigidity between the second insulation layer 3 and the first insulation layer 2 that when the micro LED 9 is pressed and welded on the TFT back panel by applying a pressing force to the micro LED 9, a pressing force may be applied to corresponding welding area of the TFT back panel, so a pressing stress may be applied to layers below the micro LED 9; and the groove 24 is arranged at the first insulation layer 2 below the welding area, and a part of the second insulation layer 3 is filled in the groove 24, where the rigidity of the second insulation layer 3 filled in the groove 24 is lower than the rigidity of the surrounding first insulation layer 2 at which the groove 24 is formed, so when the pressing stress is applied to the layers below the welding area and the stress is applied to the first insulation layer, the second insulation layer 3 in the groove 24, and the groove 24 may be deformed because the rigidity of the second insulation layer 3 in the groove is lower than the rigidity of the surrounding first insulation layer 2, so that the stress releasing structure 4 constituted by the second insulation layer 3 in the groove 24, and the groove 24 may be deformed to thereby release the stress so as to block the stress from being further propagated, thus protecting layer structures, e.g., an active layer 6, in the TFT area, so that a TFT characteristic can be avoided from being affected while the micro LED 9 is being welded.

Accordingly, in the micro LED display panel above, a groove at the first insulation layer 2 of the TFT back panel, and the second insulation layer 3 filled in the groove constitute a stress releasing structure 4, so that the stress releasing structure can be deformed while a micro LED is being pressed and welded, to thereby release the stress so as to avoid effectively the layer structures in the TFT area from being damaged by the stress, thus avoiding a TFT characteristic from being affected to thereby avoid a display abnormality.

In some embodiments, the rigidity of the first insulation layer 2 can have an order of magnitude of $10^3$, the rigidity of the second insulation layer 3 can have an order of magnitude of $10^1$, i.e. there is a difference in rigidity of 2 or 3 orders of magnitude between the first insulation layer 2 and the second insulation layer 3. For example, the rigidity of the first insulation layer 2 can be $0.4*10^3 \sim 5*10^3$, the rigidity of the second insulation layer 3 can be 7-9.5, etc.

In some embodiments, the first insulation layer 2 can be an inorganic insulation layer, and the second insulation layer 3 can be an organic insulation layer. And since the rigidity of the organic insulation layer is much lower than the rigidity of the inorganic insulation layer, that is, there is a significant difference between the rigidity of the organic insulation layer and the rigidity of the inorganic insulation layer, the organic insulation layer filled in the groove at the inorganic insulation layer can be significantly deformed when there is a pressing stress, so that the stress releasing structure 4 can better release the stress to thereby better protect the TFT area.

In the micro LED display panel above, the TFT area includes an active layer on the substrate 1 and between the substrate 1 and the first insulation layer 2, and a distance between a bottom of the groove, and the substrate is shorter than or equal to a distance between a surface of the active layer facing the substrate, and the substrate, in a direction perpendicular to the substrate. That is, the depth of the groove can extend through the second insulation layer 3, and a part of the first insulation layer 2, in the direction perpendicular to the substrate, or can extend through the second insulation layer 3 and the first insulation layer 2 in the direction perpendicular to the substrate so that the bottom of the groove is flush with the bottom of the active layer, or the depth of the groove can exceed the thicknesses of the second insulation layer and the first insulation layer, in the direction perpendicular to the substrate so that the bottom of the groove is closer to the substrate than the active layer. Thus, the stress releasing structure can be formed to better release the stress to thereby better protect the layer structures, e.g., the active layer, in the TFT area.

As illustrated in FIG. 2, in the micro LED display panel above, the groove 24 includes at least one first groove 241, where a normal projection of the first groove 241 onto the substrate 1 lies in a normal projection of a welding area of the micro LED onto the substrate, that is, the first groove 241 is located below the welding area of the micro LED (the area H as denoted in FIG. 1), and the first groove 241, and the part of the second insulation layer 3 filled in the first groove 241 constitute a stress blocking structure 41. The first groove 241 is located below the welding area of the micro LED, that is, the first groove 241 is located in the part of the first insulation layer 2 corresponding to the welding area of the micro LED, and the normal projection of the first groove 241 onto the substrate 1 does not overlap with the normal projection of the TFT area onto the substrate 1, and the normal projection of the first groove 241 onto the substrate 1 lies in the normal projection of the welding area of the micro LED onto the substrate 1. The first groove 241 is located right below the welding area of the micro LED, so the part of the second insulation layer 3 filled in the first groove 241, and the first groove 241 constitute the stress blocking structure 41, that is, the stress blocking structure 41 is located below the micro LED at a short distance from the TFT area, so when the micro LED is pressed and welded by applying a pressing force thereto, a pressing force is applied to a corresponding area, e.g., the welding area of the micro LED and the layers below the welding area, of the TFT back panel; and since the stress blocking structure 41 is arranged right below the welding area, when the first insulation layer 2 and the second insulation layer 3 are pressed, the first groove 241, and the second insulation layer 3 filled in the first groove 241 may be deformed due to the difference in rigidity between the first insulation layer 2 and the second insulation layer 3, so that the stress blocking structure 41 may be deformed to thereby release the stress so as to further prevent effectively the stress from being spread, e.g. from being propagated to the TFT area, thus protecting the active layer 6 in the TFT area, that is, a TFT characteristic can be further avoided effectively from being affected while the micro LED is being welded.

In some embodiments, the welding area includes a first connection pad 10 and a second connection pad 11 insulated from each other, and to be connected respectively with two connection pins of the micro LED, where the first connection pad 10 and the second connection pad 11 are arranged on a side of the second insulation layer 3 facing away from the first insulation layer 2.

The first groove can be positioned in a number of optional implementations.

In a first implementation: the first groove 241 is arranged in a part of the first insulation layer 2 corresponding to an area between the two connection pins of the micro LED, that is, the first groove 241 is arranged between the two connection pins of the micro LED.

In a second implementation: the first groove 241 is arranged in a part of the first insulation layer 2 corresponding to the first connection pad 10 and/or the second connection pad 11, that is, the first groove 241 is not arranged between the two connection pins of the micro LED, but the first groove 241 is arranged right below the first connection pad 10 or the second connection pad 11, or there are first grooves 241 below the first connection pad 10 and the second connection pad 11, respectively.

In some embodiments, a bottom of the first groove 241 (i.e. a surface proximate to the substrate 1) is shaped as a circle, and a diameter of the bottom of the first groove 241 can be larger than or equal to 5 μm, and smaller than or equal to 8 μm. That is, the diameter of the bottom of the first groove 241 can be selected from the range of 5 μm to 8 μm according to a particular setting of a pixel in the TFT back panel, for example, can be 5 μm, 6 μm, or 7 μm, or can be another value, although the embodiments of the disclosure will not be limited thereto.

In some embodiments, as illustrated in FIG. 1 and FIG. 2, a section of the first groove perpendicular to the substrate is an inverted trapezoid, that is, side surfaces of the first groove 241 are inclined, and a size of an opening of the first groove 241 is larger than a size of the bottom of the first groove 241, where angles between side edges of the trapezoid, and a plane parallel to the substrate 1 are larger than or equal to 30°, and smaller than or equal to 70°. For the sake of a convenient description, the plane parallel to the substrate 1 is horizontal, and the side surfaces of the first groove 241 are arranged as inclined side surfaces, where the angles between the inclined side surfaces and the horizontal plane range from 30° to 70°, that is, the side surfaces of the first groove 241 are inclined outward by 30° to 70°, thus resulting in a better corresponding stress blocking effect of the formed stress blocking structure 41. In some embodiments, the angles at which the side surfaces of the first groove 241 are inclined can be set to 40°, 45°, 50°, or 60°, although the embodiments of the disclosure will not be limited thereto.

As illustrated in FIG. 2 and FIG. 3, in the micro LED display panel above, the groove 24 further includes at least one second groove 242, where a normal projection of the second groove 242 onto the substrate 1 lies around the normal projection of the welding area of the micro LED onto the substrate 1, and the second groove 242, and a part of the second insulation layer 3 filled in the second groove 242 constitute a stress guiding structure 42. The normal projection of the second groove 242 onto the substrate 1 does not overlap with the normal projection of the welding area of the TFT onto the substrate 1, and the normal projection of the second groove 242 onto the substrate 1 lies around the normal projection of the welding area of the micro LED onto the substrate 1. The second groove 242 is arranged around the micro LED, so the stress guiding structure 42 constituted by the second groove 242, and the second insulation layer 3 filled in the second groove 242 is located around the welding area of the micro LED; and since there is a difference in rigidity between the first insulation layer 2 and the second insulation layer 3, a pressing force is applied to the first insulation layer 2 and the second insulation layer 3 when the micro LED is pressed and welded, so the stress guiding structure 42 subject to a pressing stress may be deformed, and the stress guiding structure 42 around the welding area can guide the stress applied in the welding area, that is, can guide a part of the stress in the welding area to the stress guiding structure capable of releasing the stress, so the stress can be alleviated from being spread into the TFT area to thereby guarantee the stability of a TFT characteristic, and the display effect of the micro LED.

In some embodiments, in the micro LED display panel according to the embodiments of the disclosure, as illustrated in FIG. 1, a stress releasing structure can be only arranged right below a welding area of a micro LED in the micro LED back panel to thereby form a stress blocking structure 41, or a stress releasing structure can be only arranged around the welding area of the micro LED to thereby form a stress guiding structure 42. Further, in order to better avoid a stress from affecting the TFT area to thereby better protect a TFT characteristic, as illustrated in FIG. 3, when there is a stress blocking structure arranged right below the welding area of the micro LED, there is also a stress guiding structure arranged around the welding area of the micro LED.

In some embodiments, the shape and the size of the second groove 242 can be set the same as the shape and the size of the first groove 241, for example, a bottom of the second groove 242 can also be shaped as a circle, and a diameter of the bottom of the second groove 242 can be larger than or equal to 5 μm, and smaller than or equal to 8 μm. In some embodiments, the diameter of the bottom of the second groove 242 can be selected from 5 μm, 6 μm, or 7 μm, or can be another value, although the embodiments of the disclosure will not be limited thereto.

As illustrated in FIG. 2 and FIG. 3, the side surfaces of the second groove 242 are also arranged as inclined side surfaces, and a section of the second groove perpendicular to the substrate can also be an inverted trapezoid, that is, the size of the opening of the second groove 242 is larger than the size of the bottom of the second groove 242, where the angles between the side edges of the inverted trapezoid, and the plane parallel to the substrate 1 are larger than or equal to 30°, and smaller than or equal to 70°, i.e. the side surfaces of the second groove 242 are inclined outward by 30° to 70°, thus resulting in a better corresponding stress guiding effect of the formed stress guiding structure 42. In some embodiments, the angles at which the side surfaces of the second groove 242 are inclined can be set to 40°, 45°, 50°, or 60°, although the embodiments of the disclosure will not be limited thereto.

In order to guarantee the stress releasing effect of the stress releasing structures 4, i.e., the stress blocking structure 41 and the stress guiding structure 42, a thickness of the second insulation layer 3 can be increased as appropriate. In some embodiments, the thickness, of a part of the second insulation layer 3 other than the part of the second insulation layer 3 filled in the groove, in the direction perpendicular to the substrate 1 is set larger than or equal to 2.5 μm, e.g., can be set to 2.8 μm, 3 μm, or 3.5 μm, although the embodiments of the disclosure will not be limited thereto. Further, the thickness of the part of the second insulation layer 3 filled in the groove, i.e., the first groove and/or the second groove, i.e., the depth of the groove, can be set as needed according to the thickness of the first insulation layer 2, and other factors as long as a better stress releasing effect can be achieved. Accordingly, the thickness of the part of the second insulation layer 3 filled in the groove, or the depth of the groove will not be limited to any particular thickness or depth in the embodiments of the disclosure.

In some embodiments, as illustrated in FIG. 1, the TFT back panel can include: a buffer layer 5, an active layer 6, a first gate insulation layer 21, a gate layer 7, a second gate insulation layer 22, and an interlayer dielectric layer 23 stacked over the substrate 1 in that order, where the first gate insulation layer 21, the second gate insulation layer 22, and the interlayer dielectric layer 23 constitute the first insulation layer 2; a source and drain layer 8 on a side of the interlayer dielectric layer 23 facing away from the second gate insulation layer 22, and electrically connected with the active layer; and a planarization layer on a side of the source and drain layer 8 and the interlayer dielectric layer 23 facing away from the second insulation layer, where the planarization layer constitutes the second insulation layer 3. As can be apparent, the TFT back panel is a top-gate TFT back panel, and the TFT back panel in the embodiments of the disclosure can alternatively be a bottom-gate TFT back panel, although the embodiments of the disclosure will not be limited thereto.

In some embodiments, in order for a better stress releasing effect of the stress releasing structure 4, the bottom of the groove can be arranged flush with the surface of the active layer 6 at the TFT device layer facing the substrate 1, and in some embodiments, when the TFT back panel is a top-gate TFT back panel, the groove can be arranged to extend through the second insulation layer 22, the first gate insulation layer 21, and the interlayer dielectric layer 23.

Figure 4:
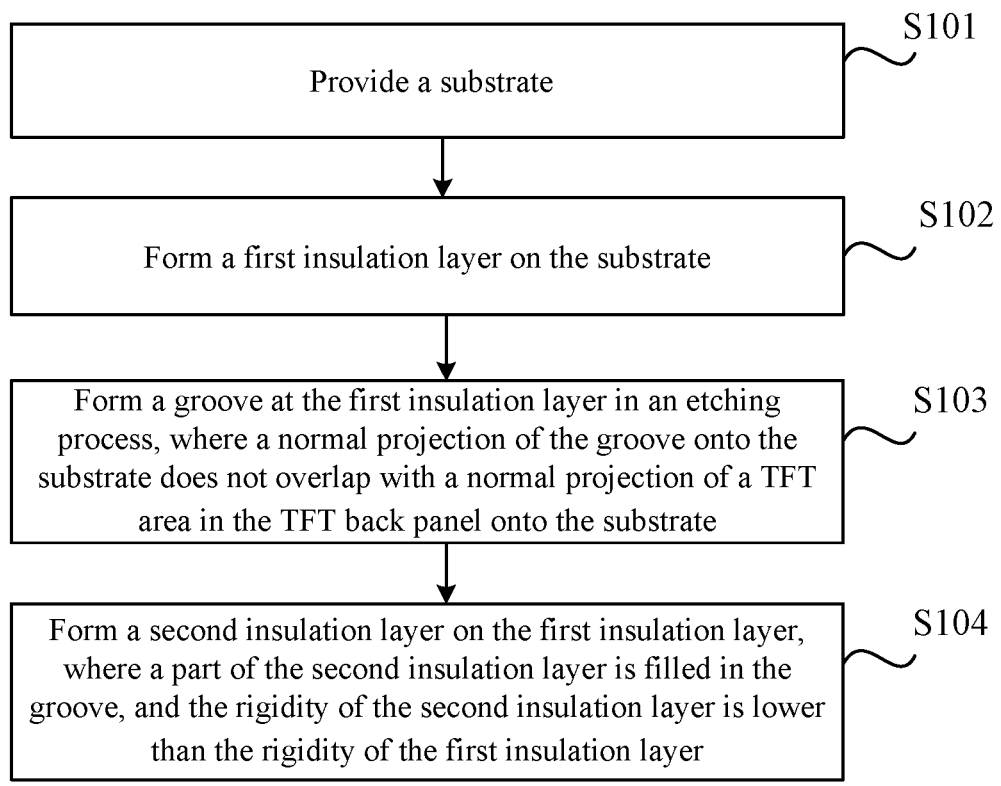
FIG. 4 is a schematic structural diagram of a micro LED display panel according to the embodiments of the disclosure.

Based upon the same inventive concept, as illustrated in FIG. 4, the embodiments of the disclosure further provide a method for fabricating a micro LED display panel including a TFT back panel, and a micro LED fixed on the TFT back panel, where the method includes the following operations.

The operation S101 is to provide a substrate 1.

The operation S102 is to form a first insulation layer 2 on the substrate 1.

The operation S103 is to form a groove 24 at the first insulation layer 2 in an etching process, where a normal projection of the groove 24 onto the substrate 1 does not overlap with a normal projection of a TFT area in the TFT back panel onto the substrate 1.

The operation S104 is to form a second insulation layer 3 on the first insulation layer 2, where a part of the second insulation layer 3 is filled in the groove 24, and the rigidity of the second insulation layer 3 is lower than the rigidity of the first insulation layer 2.

In the fabricating method above, the groove at the first insulation layer 2 of the TFT back panel, and the second insulation layer 3 filled in the groove 24 constitute a stress releasing structure 4, so that the stress releasing structure can be deformed while the micro LED is being welded, to thereby release a stress so as to avoid effectively an active layer 6 in the TFT area from being damaged, thus avoiding a TFT characteristic from being affected to thereby avoid a display abnormality.

In some embodiments, the fabricating method above includes: providing the substrate 1; forming a buffer layer 5, an active layer 6, a first gate insulation layer 21, a gate layer 7, a second gate insulation layer 22, and an interlayer dielectric layer 23 stacked over the substrate 1 in that order; forming a via-hole 25 extending through the first gate insulation layer 21, the second gate insulation layer 22, and the interlayer dielectric layer 23 in an etching process, and forming the groove 24 at the first gate insulation layer 21, the second gate insulation layer 22, and the interlayer dielectric layer 23, where the groove 24 does not overlap with the TFT area in the TFT back panel; forming a patterned source and drain layer 8 on the interlayer dielectric layer to be electrically connected with the active layer 6 through the via-hole 25; and forming a planarization layer on the patterned source and drain layer 8 and the interlayer dielectric layer 23, where the planarization layer constitutes the second insulation layer 3, a part of the planarization layer is filled in the groove 24, and the part of the planarization layer filled in the groove 24, and the groove 24 constitute the stress releasing structure 4. In the fabricating method above, the stress releasing structure 4 in the TFT back panel can be deformed while the micro LED is being pressed and welded, to thereby release a stress so as to avoid effectively the layer structures in the TFT area from being damaged by the stress, thus avoiding a TFT characteristic from being affected, and thus avoiding a display abnormality. Further, the groove 24 can be formed together with the via-hole 25 without any additional formation process, to thereby simplify a fabrication process.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A micro Light Emitting Diode (LED) display panel, comprising:
    a Thin Film Transistor (TFT) back panel; and
    a micro LED fixed on the TFT back panel, wherein the TFT back panel comprises a substrate, and a first insulation layer and a second insulation layer stacked over the substrate in that order;
    wherein the TFT back panel further comprises:
        a buffer layer, an active layer, a first gate insulation layer, a gate layer, a second gate insulation layer, and an interlayer dielectric layer stacked over the substrate in that order;
        a source and drain layer on a side of the interlayer dielectric layer facing away from the second gate insulation layer, and electrically connected with the active layer; and
        a planarization layer on a side of the source and drain layer and the interlayer dielectric layer facing way from the second insulation layer;
    wherein the first insulation layer comprises the first gate insulation layer, the second gate insulation layer, and the interlayer dielectric layer, and the second insulation layer comprises the planarization layer;
    wherein the first insulation layer comprises a groove filled with the second insulation layer, and a normal projection of the groove onto the substrate does not overlap with a normal projection of a TFT area in the TFT back panel onto the substrate, and a rigidity of the second insulation layer is lower than a rigidity of the first insulation layer; and
    wherein the groove comprises at least one first groove, and a normal projection of the at least one first groove onto the substrate lies in a normal projection of a welding area of the micro LED onto the substrate.

2. The micro LED display panel according to claim 1, wherein the first insulation layer is an inorganic insulation layer, and the second insulation layer is an organic insulation layer.

3. The micro LED display panel according to claim 1, wherein the TFT area comprises an active layer, and a distance between a bottom of the groove, and the substrate is shorter than or equal to a distance between a surface of the active layer facing the substrate, and the substrate, in a direction perpendicular to the substrate.

4. The micro LED display panel according to claim 1, wherein the welding area comprises a first connection pad and a second connection pad insulated from each other, and to be connected respectively with two connection pins of the micro LED, and the first connection pad and the second connection pad are on a side of the second insulation layer facing away from the first insulation layer.

5. The micro LED display panel according to claim 4, wherein the at least one first groove is arranged in a part of the first insulation layer corresponding to an area between the two connection pins of the micro LED; or
    the at least one first groove is arranged in a part of the first insulation layer corresponding to the first connection pad and/or the second connection pad.

6. The micro LED display panel according to claim 1, wherein the groove further comprises at least one second groove, and a normal projection of the at least one second groove onto the substrate lies around the normal projection of the welding area of the micro LED onto the substrate.

7. The micro LED display panel according to claim 1, wherein a bottom of the groove is shaped as a circle, and a diameter of the circle is larger than or equal to 5 μm, and smaller than or equal to 8 μm.

8. The micro LED display panel according to claim 1, wherein a section of the groove perpendicular to the substrate is an inverted trapezoid, and angles between side edges of the trapezoid, and a plane parallel to the substrate are larger than or equal to 30°, and smaller than or equal to 70°.

9. The micro LED display panel according to claim 1, wherein a thickness, of a part of the second insulation layer other than a part of the second insulation layer filled in the groove, in a direction perpendicular to the substrate is larger than or equal to 2.5 μm.

10. The micro LED display panel according to claim 1, wherein the groove extends through the second gate insulation layer, the first gate insulation layer, and the interlayer dielectric layer.

11. A method for fabricating the micro Light Emitting Diode (LED) display panel according to claim 1, wherein the method comprises:
    providing the substrate;
    forming the first insulation layer on the substrate;
    forming the groove at the first insulation layer in an etching process, wherein the normal projection of the groove onto the substrate does not overlap with the normal projection of the TFT area in the TFT back panel onto the substrate; and
    forming the second insulation layer on the first insulation layer, wherein a part of the second insulation layer is filled in the groove, and the rigidity of the second insulation layer is lower than the rigidity of the first insulation layer.

* * * * *